US010706951B2

(12) United States Patent
 Anzou

(10) Patent No.: US 10,706,951 B2
(45) Date of Patent: Jul. 7, 2020

(54) SEMICONDUCTOR INTEGRATED CIRCUIT INCLUDING A MEMORY MACRO

(71) Applicants: KABUSHIKI KAISHA TOSHIBA, Minato-ku (JP); Toshiba Electronic Devices & Storage Corporation, Minato-ku (JP)

(72) Inventor: Kenichi Anzou, Kawasaki (JP)

(73) Assignees: KABUSHIKI KAISHA TOSHIBA, Minato-ku (JP); Toshiba Electronic Devices & Storage Corporation, Minato-ku (JP)

( * ) Notice: Subject to any disclaimer, the term of this patent is extended or adjusted under 35 U.S.C. 154(b) by 17 days.

(21) Appl. No.: 16/122,484

(22) Filed: Sep. 5, 2018

(65) Prior Publication Data

US 2019/0295680 A1    Sep. 26, 2019

(30) Foreign Application Priority Data

Mar. 23, 2018  (JP) .................................. 2018-055935

(51) Int. Cl.
  *G06F 11/00*  (2006.01)
  *G11C 29/42*  (2006.01)
  *G06F 11/10*  (2006.01)

(52) U.S. Cl.
  CPC .......... *G11C 29/42* (2013.01); *G06F 11/1052* (2013.01)

(58) Field of Classification Search
  CPC .............................. G11C 29/42; G06F 11/1052
  See application file for complete search history.

(56) References Cited

U.S. PATENT DOCUMENTS

| 7,266,735 | B2  |   | 9/2007 | Hirabayashi |             |
|-----------|-----|---|--------|-------------|-------------|
| 7,526,700 | B2  | * | 4/2009 | Motomochi   | G01R 31/2863|
|           |     |   |        |             | 714/718     |
| 7,770,083 | B2  | * | 8/2010 | Whetsel     | G01R 31/31855|
|           |     |   |        |             | 714/726     |
| 8,438,344 | B2  | * | 5/2013 | Kumar       | G06F 11/1052|
|           |     |   |        |             | 365/189.02  |
| 8,671,329 | B2  | * | 3/2014 | Kumar       | G06F 11/1052|
|           |     |   |        |             | 365/189.02  |

(Continued)

FOREIGN PATENT DOCUMENTS

JP    10-247166    9/1998
JP    3940713      7/2007

(Continued)

*Primary Examiner* — Esaw T Abraham
(74) *Attorney, Agent, or Firm* — Oblon, McClelland, Maier & Neustadt, L.L.P.

(57) ABSTRACT

In general, according to one embodiment, there is provided a semiconductor integrated circuit including a memory macro. The memory macro includes a first ECC circuit that generates a code corresponding to input data, a memory core including a data storage portion on which reading and writing of data is performed, and an ECC storage portion on which reading and writing of a code is performed, a second ECC circuit that executes, based on data and code read from the memory core, error detection or correction of the data, and circuits that form a path in which data flows to bypass the memory core in a scan test, and form a path in which data flows through each of the data storage portion and the ECC storage portion in a memory test.

11 Claims, 6 Drawing Sheets

(56) References Cited

U.S. PATENT DOCUMENTS

| | | | |
|---|---|---|---|
| 8,726,114 B1 * | 5/2014 | Vahidsafa | G11C 29/1201 714/718 |
| 9,285,425 B2 * | 3/2016 | Whetsel | G01R 31/31855 |
| 9,671,462 B2 * | 6/2017 | Whetsel | G01R 31/31855 |
| 10,163,470 B2 * | 12/2018 | Cheng | G11C 11/413 |
| 10,319,459 B1 * | 6/2019 | Gregor | G11C 29/38 |
| 2007/0007985 A1 * | 1/2007 | Motomochi | G01R 31/2863 324/750.05 |
| 2007/0255981 A1 * | 11/2007 | Eto | G06F 11/1008 714/710 |
| 2009/0319840 A1 | 12/2009 | Hara et al. | |
| 2011/0072323 A1 | 3/2011 | Chong et al. | |
| 2018/0238965 A1 | 8/2018 | Anzou et al. | |

FOREIGN PATENT DOCUMENTS

| | | |
|---|---|---|
| JP | 2008-176828 | 7/2008 |
| JP | 2010-9642 | 1/2010 |
| JP | 5441857 | 3/2014 |
| JP | 5661143 | 1/2015 |
| JP | 2018-137024 | 8/2018 |

* cited by examiner

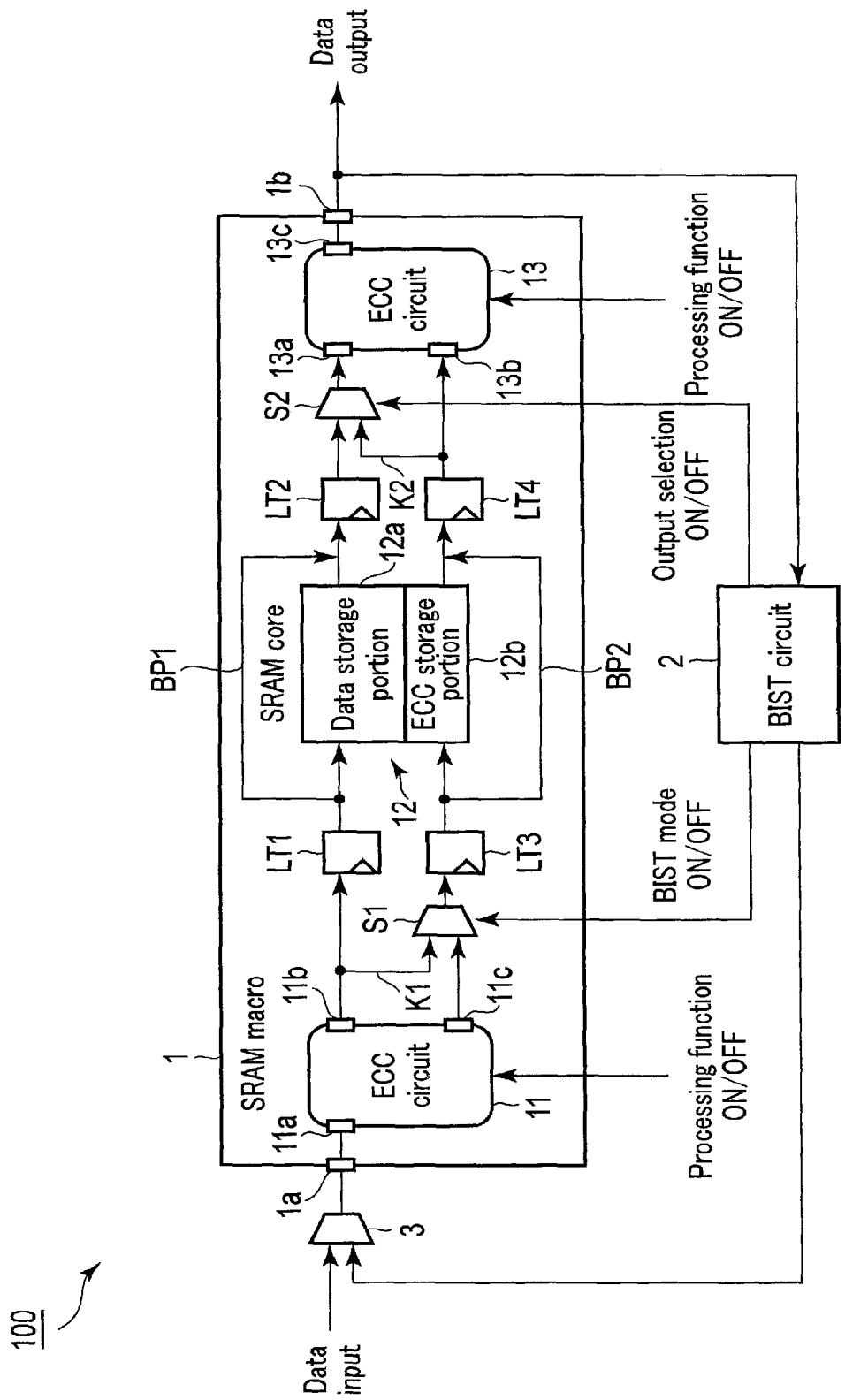
F I G. 1

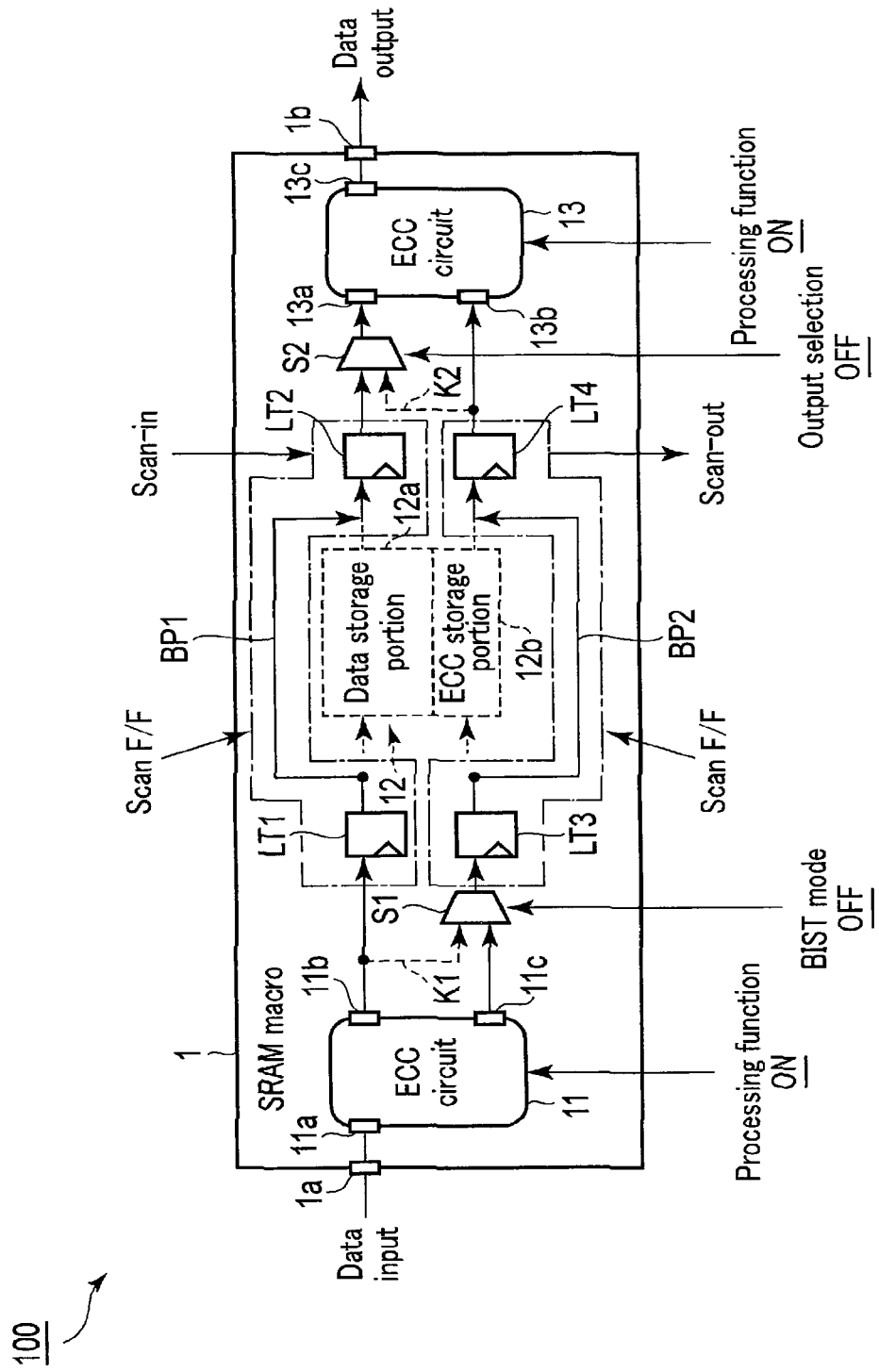
F I G. 3

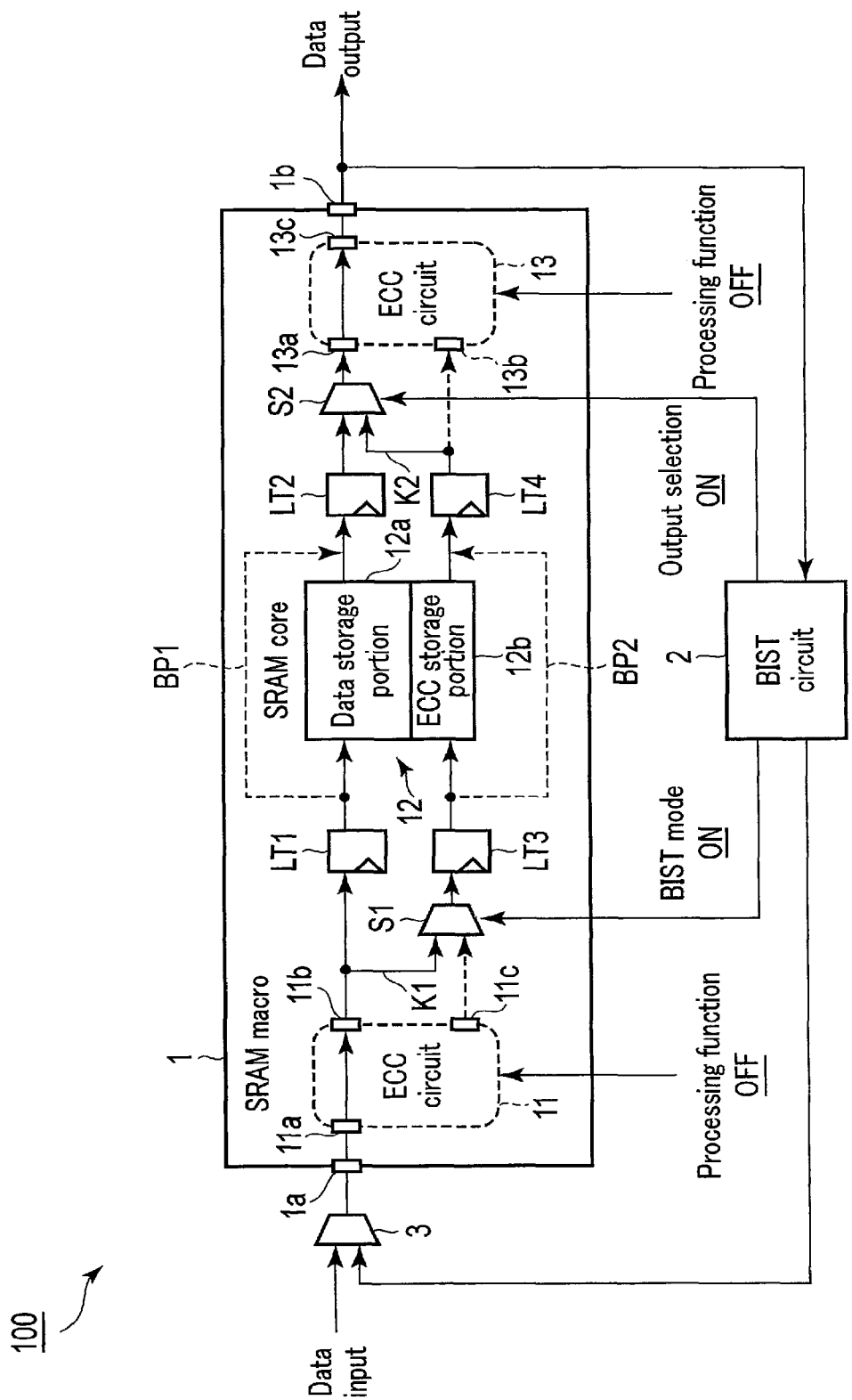
F I G. 6

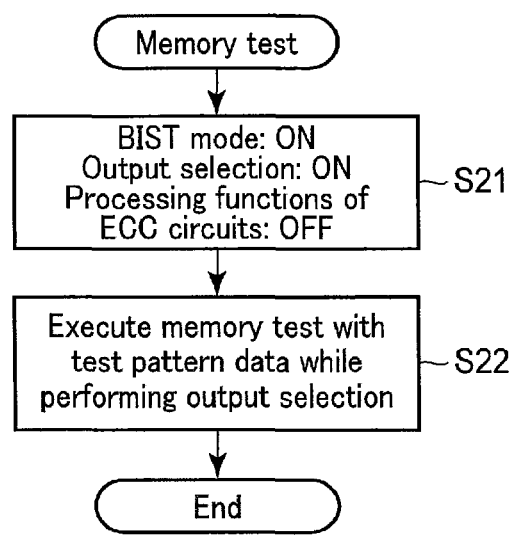
F I G. 7

SEMICONDUCTOR INTEGRATED CIRCUIT INCLUDING A MEMORY MACRO

CROSS-REFERENCE TO RELATED APPLICATIONS

This application is based upon and claims the benefit of priority from Japanese Patent Application No. 2018-055935, filed Mar. 23, 2018, the entire contents of which are incorporated herein by reference.

FIELD

Embodiments described herein relate generally to a semiconductor integrated circuit.

BACKGROUND

In semiconductor integrated circuits in which an error correction code (ECC) circuit executing error detection and correction of data read from a static random access memory (SRAM) is provided outside a memory macro, there is a method of executing both a test for an ECC circuit and a test for a memory.

BRIEF DESCRIPTION OF THE DRAWINGS

FIG. 1 is a schematic diagram illustrating an example of a schematic configuration of a semiconductor integrated circuit according to an embodiment;

FIG. 3 is a schematic diagram illustrating an example of a state of the semiconductor integrated circuit when a scan test is executed;

FIG. 6 is a schematic diagram illustrating an example of a state of the semiconductor integrated circuit when a memory test is executed; and FIG. 7 is a flowchart illustrating an example of operations of the semiconductor integrated circuit when a memory test is executed.

DETAILED DESCRIPTION

Figure 2:
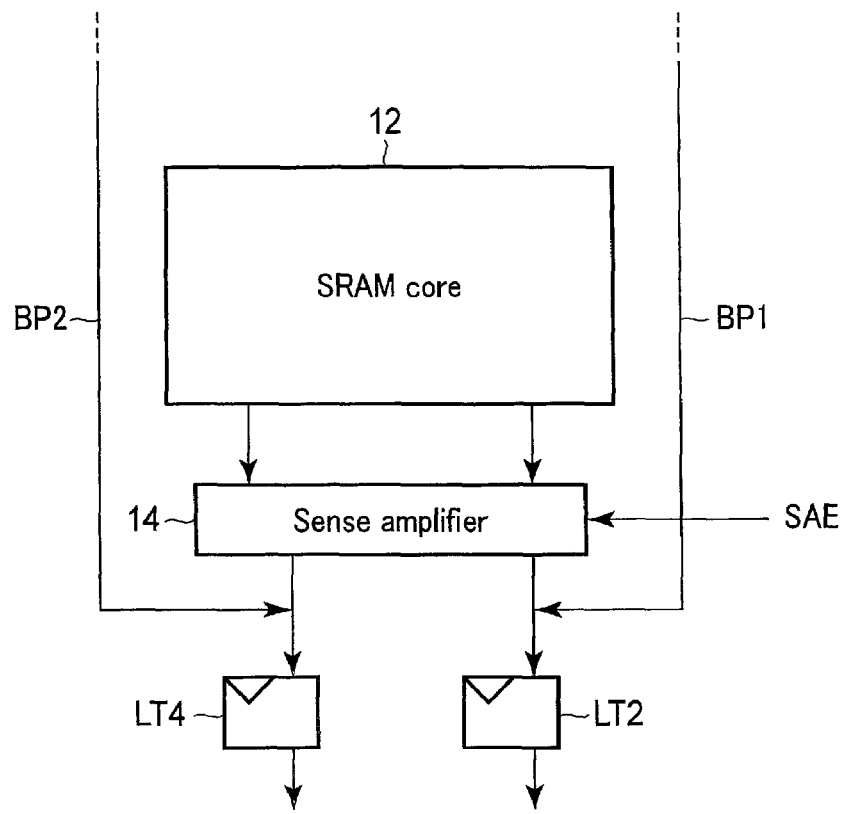
FIG. 2 is a diagram for explaining an example of switching of a path using a sense amplifier.

Embodiments will be explained hereinafter with reference to drawings. In the following explanation, constituent elements with the same functions and the structures are denoted by the same reference numerals.

In general, according to one embodiment, there is provided a semiconductor integrated circuit including a memory macro. The memory macro includes a first ECC circuit that generates an error detection and correction code corresponding to input data, a memory core including a data storage portion on which reading and writing of data is performed, and an ECC storage portion on which reading and writing of a code is performed, a second ECC circuit that executes, based on data and code read from the memory core, error detection or correction of the data, and circuits that form a path in which data flows to bypass the memory core in a scan test, and form a path in which data flows through each of the data storage portion and the ECC storage portion in a memory test.

FIG. 1 is a schematic diagram illustrating an example of a schematic configuration of a semiconductor integrated circuit according to an embodiment.

A semiconductor integrated circuit 100 illustrated in FIG. 1 includes a static random access memory (SRAM) macro 1. A built-in self-test (BIST) circuit 2 and a selector 3 are arranged around the SRAM macro 1.

The SRAM macro 1 receives data transmitted from a predetermined circuit or data transmitted from the BIST circuit 2 with an input terminal 1a, and temporarily writes the input data to a SRAM provided therein. The SRAM macro 1 also reads data from the SRAM, and outputs the read data from an output terminal 1b. The output data is transmitted to the predetermined circuit or the BIST circuit 2.

The BIST circuit 2 is a circuit to execute a memory test for a SRAM core 12.

The selector 3 selects a path to make one of two paths effective, in accordance with a predetermined selection signal (not illustrated) supplied from the outside. The two paths include a path in which data transmitted from the predetermined circuit is transmitted to the input terminal 1a of the SRAM macro 1, and a path in which data transmitted from the BIST circuit 2 is transmitted to the input terminal 1a of the SRAM macro 1.

The SRAM macro 1 includes a first error correction code (ECC) circuit 11 that generates an error detection and correction code corresponding to the input data, a SRAM core 12 including a data storage portion 12a on which reading and writing of data is performed and an ECC storage portion 12b on which reading and writing of a code is performed, and a second ECC circuit 13 that executes, based on data and code read from the SRAM core 12, error detection or correction of the data, and the like. The SRAM macro 1 also includes basic circuit elements, such as latch circuits LT1, LT2, LT3, and LT4, and various signal lines arranged therein.

The logic including the ECC circuits 11 and 13 in the SRAM macro 1 corresponds to a target of a scan test. By contrast, each of the data storage portion 12a and the ECC storage portion 12b in the SRAM core 12 corresponds to a target of a memory test (BIST).

The SRAM macro 1 according to the present embodiment includes circuits to form a path in which the data flows to bypass the SRAM core 12 when a scan test is executed for the logic including the ECC circuits 11 and 13, and form a path in which the data flows through each of the data storage portion 12a and the ECC storage portion 12b when a memory test (BIST) is executed for the data storage portion 12a and the ECC storage portion 12b of the SRAM core 12. For example, circuit elements, such as selectors S1 and S2, and signal lines, such as paths K1 and K2 and bypasses BP1 and BP2, are arranged in the SRAM macro 1, in addition to the basic circuit elements and the signal lines described above.

The code generating function of the ECC circuit 11 is set to one of states, that is, an enabled state and a disabled state, in accordance with a predetermined signal supplied from the outside.

For example, when the code generating function of the ECC circuit 11 is set to an enabled state, the ECC circuit 11 executes ordinary processing including code generation. Specifically, the ECC circuit 11 receives data transmitted through the input terminal 1a with a data input terminal 11a, generates a code corresponding to the input data, outputs the input data from a data output terminal 11b without any processing, and outputs the generated code from a code output terminal 11c.

By contrast, when the code generating function of the ECC circuit 11 is set to a disabled state, the ECC circuit 11 executes no code generation or code output processing, but outputs the data input from the data input terminal 11a from the data output terminal 11b without any processing.

The latch circuit LT1 inputs, retains, and outputs the data transmitted from the data output terminal 11b of the ECC circuit 11, in accordance with a clock (not illustrated) supplied from the outside.

The latch circuit LT3 inputs, retains, and outputs the code transmitted from the code output terminal 11c of the ECC circuit 11 through the selector S1, or inputs, retains, and outputs the data transmitted from the data output terminal 11b of the ECC circuit 11 through the selector S1, in accordance with a clock (not illustrated) supplied from the outside.

The selector S1 selects a path such that one of the path in which the code transmitted from the code output terminal 11c of the ECC circuit 11 is transmitted to the latch circuit LT3 and the path in which the data transmitted from the data output terminal 11b of the ECC circuit 11 through the path K1 is transmitted to the latch circuit LT3 is made effective, in accordance with a predetermined signal transmitted from the BIST circuit 2.

The data storage portion 12a includes memory cells to which the data transmitted from the latch circuit LT1 is written. By contrast, the ECC storage portion 12b includes memory cells to which the code (or data) transmitted from the latch circuit LT3 is written.

The bypass BP1 is made effective when the data transmitted from the latch circuit LT1 is caused to bypass the SRAM core 12 to be transmitted to the latch circuit LT2, in a state where the reading and writing function of the SRAM core 12 is disabled. In this case, the latch circuit LT1 and the latch circuit LT2 are caused to operate as a flip-flop together.

In the same manner, the bypass BP2 is made effective when the code (or data) transmitted from the latch circuit LT3 is caused to bypass the SRAM core 12 to be transmitted to the latch circuit LT4, in a state where the reading and writing function of the SRAM core 12 is disabled. In this case, the latch circuit LT3 and the latch circuit LT4 are caused to operate as a flip-flop together.

A switch may be used to switch the path in which the data flows through the data storage portion 12a with the path in which the data bypasses the data storage portion 12a and flows through the bypass BP1, and switch the path in which the code (or data) flows through the ECC storage portion 12b with the path in which the code (or data) bypasses the ECC storage portion 12b and flows through the bypass BP2. However, for example, as illustrated in FIG. 2, the switching may be achieved by turning on/off a sense amplifier enable signal SAE supplied to a sense amplifier 14 of the SRAM core 12. In FIG. 2, illustration of a row decoder and a column selection circuit provided in the SRAM core 12 is omitted.

The latch circuit LT2 inputs, retains, and outputs the data read from the data storage portion 12a, or inputs, retains, and outputs the data transmitted from the latch circuit LT1 through the bypass BP1, in accordance with a clock (not illustrated) supplied from the outside.

The latch circuit LT4 inputs, retains, and outputs the code (or data) read from the ECC storage portion 12b, or inputs, retains, and outputs the code (or data) transmitted from the latch circuit LT3 through the bypass BP2, in accordance with a clock (not illustrated) supplied from the outside.

The selector S2 selects a path such that one of the path in which the data transmitted from the latch circuit LT2 is transmitted to a data input terminal 13a of the ECC circuit 13 and the path in which the code (or data) transmitted from the latch circuit LT4 through the path K2 is transmitted to the data input terminal 13a of the ECC circuit 13 is made effective, in accordance with a predetermined signal transmitted from the BIST circuit 2.

The data error detection and correction function of the ECC circuit 13 is set to one of states, that is, an enabled state and a disabled state, in accordance with a predetermined signal supplied from the outside.

For example, when the data error detection and correction function of the ECC circuit 13 is set to an enabled state, the ECC circuit 13 executes ordinary processing including data error detection and correction. Specifically, the ECC circuit 13 receives the data transmitted from the selector S2 with the data input terminal 13a, receives the code transmitted from the latch circuit LT4 with a code input terminal 13b, executes error detection or correction processing of the data on the basis of the input data and the code, and outputs the processed data from a data output terminal 13c.

By contrast, when the data error detection and correction function of the ECC circuit 13 is set to a disabled state, the ECC circuit 13 executes no code reception or data error detection using the code, but outputs the data input from the data input terminal 13a to the outside through the data output terminal 13c without any processing.

The BIST circuit 2 has a function of transmitting a BIST mode signal indicating whether the memory mode (BIST mode) to execute a memory test is in the on-state to the selector S1. When the BIST mode is set to the off-state with the BIST mode signal, the selector S1 selects a code output from the code output terminal 11c of the ECC circuit 11. By contrast, when the BIST mode is set to the on-state, the selector S1 selects a data output from the data output terminal 11b of the ECC circuit 11.

In addition, the BIST circuit 2 has a function of transmitting an output selection signal to instruct which of the data from the data storage portion 12a and the data from the ECC storage portion 12b is to be output in the state where the BIST mode is in the on-state to the selector S2. When the output selection for the selector S2 is set to the off-state with the output selection signal, the selector S2 selects a data output from the data storage portion 12a. By contrast, when the output selection for the selector S2 is set to the on-state, the selector S2 selects a data output from the ECC storage circuit 12b.

The BIST circuit 2 also has a function of executing a test for each of the data storage portion 12a and the ECC storage portion 12b, by operating the selector S2 to execute output selection, and supplying test data of a predetermined test pattern to each of the data storage portion 12a and the ECC storage portion 12b in the SRAM macro 1 to check the output data.

For example, a check mechanism using a Hamming code may be used for the ECC circuits 11 and 13 described above, but the structure is not limited thereto. In the case of applying a check mechanism using a Hamming code, a parity bit may be further generated from the Hamming code, to execute error correction and detection with a combination of check of the Hamming code and check of the parity bit.

Figure 4:
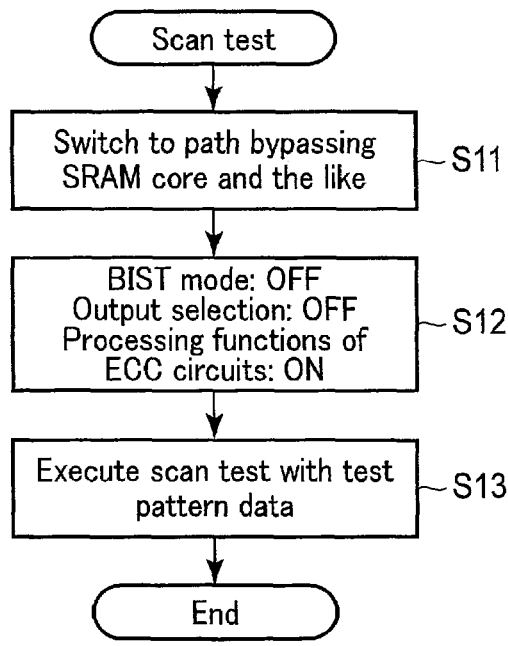
FIG. 4 is a flowchart illustrating an example of operations of the semiconductor integrated circuit when a scan test is executed.

The following is an explanation of an example of operations performed when a scan test is executed, with reference to FIG. 3 and FIG. 4.

FIG. 3 is a schematic diagram illustrating an example of a state of the semiconductor integrated circuit 100 when a scan test is executed. FIG. 4 is a flowchart illustrating an example of operations of the semiconductor integrated circuit 100 when a scan test is executed.

In the scan mode in which a scan test is executed, the path is switched such that the data flows to bypass the SRAM core 12 in the SRAM macro 1 (S11 in FIG. 4).

Specifically, the reading and writing functions of the data storage portion 12a and the ECC storage portion 12b of the SRAM core 12 are set to the disabled states, the bypass BP1 connecting the latch circuit LT1 with the latch circuit LT2 is made effective, and the bypass BP2 connecting the latch circuit LT3 with the latch circuit LT4 is made effective. More specifically, the latch circuit LT1 and the latch circuit LT2 are caused to operate as a flip-flop together. In the same manner, the latch circuit LT3 and the latch circuit LT4 are caused to operate as a flip-flop together.

Figure 5:
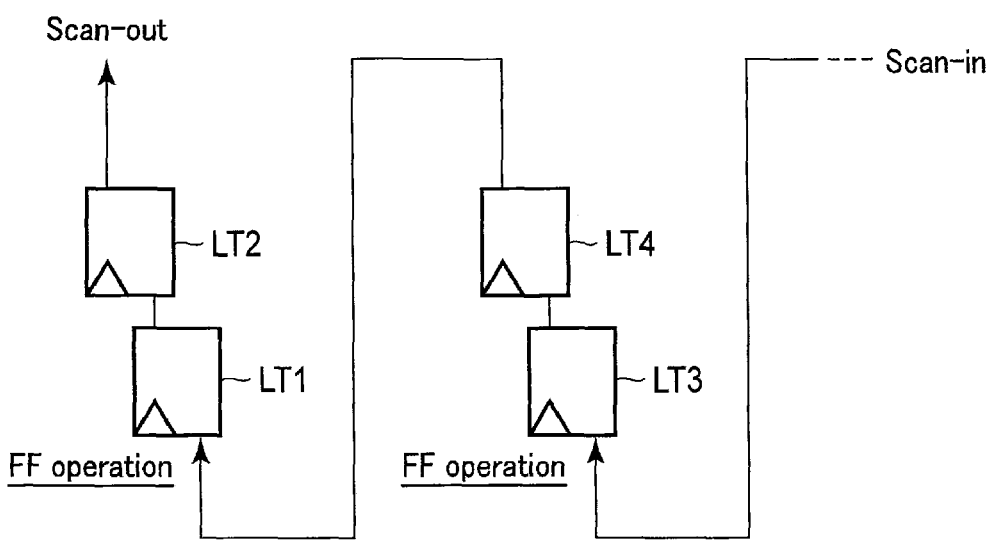
FIG. 5 is a diagram for explaining an example of a connection form of latch circuits when a scan test is executed.

In this state, for example, the latch circuits LT1, LT2, LT3, and LT4 are configured to be connected in series, as illustrated in FIG. 5. In FIG. 5, illustration of the logic other than the latch circuits LT1, LT2, LT3, and LT4 is omitted. This structure forms a scan chain capable of successively supplying test data from scan-in to scan-out.

In the scan mode, the BIST mode for the selector S1 is set to the off-state, the output selection for the selector S2 is set to the off-state, and the processing functions of the ECC circuits 11 and 13 are set to the on-states (S12). To execute a scan test also for the BIST circuit 2, it is desirable to separately prepare a mode to select a path flowing through the BIST circuit 2, to enable execution of a scan test for the circuits including the BIST circuit 2 by selection of the mode.

In this manner, the selector S1 forms a path (the path equal to that in ordinary operation) connecting the code output terminal 11c of the ECC circuit 11 with the latch circuit LT3. The selector S2 forms a path (the path equal to that in ordinary operation) connecting the latch circuit LT2 with the data input terminal 13a of the ECC circuit 13. In addition, the ECC circuit 11 is set to a state in which the code generating function is disabled, in the same manner as the ordinary operation. The ECC circuit 13 is set to a state in which the data error detection and correction function is enabled, in the same manner as the ordinary operation.

Thereafter, a scan test is executed using test data of a predetermined test pattern (S13).

In the scan test, test data is caused to be supplied from the input terminal 1a of the SRAM macro 1 into the SRAM macro 1. In this manner, the ECC circuit 11 generates a code corresponding to the test data. The test data is output from the data output terminal 11b of the ECC circuit 11, flows through the latch circuits LT1 and LT2 and the selector S2 without flowing through the data storage portion 12a, and is transmitted to the ECC circuit 13. In addition, the code generated with the ECC circuit 11 is output from the code output terminal 11c of the ECC circuit 11, flows through the selector S1 and the latch circuits LT3 and LT4 without flowing through the ECC storage portion 12b, and is transmitted to the ECC circuit 13. In this manner, the ECC circuit 13 executes error correction or correction of the data on the basis of the input test data and the code, and outputs the processed test data from the data output terminal 13c. In this manner, the processed test data is output from the output terminal 1b of the SRAM macro 1, and checked.

In addition, in the scan test, test data is input from a scan-in input terminal (not illustrated) provided in the SRAM macro 1, to pass through the scan chain formed of the logic including the latch circuits LT1 and LT2 (which correspond to a scan flip-flop), and LT3 and LT4 (which correspond to a scan flip-flop). Data items passing through the scan chain are shifted in the scan flip-flops. The data items are applied to a test for circuits provided on an output side of the scan flip-flops. Data items resulting from the circuits provided on an input side of the scan flip-flops are captured by the scan flip-flops. Data items, which are shifted out from the scan flip-flops, pass through the scan chain and are output from a scan-out output terminal (not illustrated) provided in the SRAM macro 1, and are checked.

The following is an explanation of an example of operations performed when a memory test is executed, with reference to FIG. 6 and FIG. 7.

FIG. 6 is a schematic diagram illustrating an example of a state of the semiconductor integrated circuit 100 when a memory test is executed. FIG. 7 is a flowchart illustrating an example of operations of the semiconductor integrated circuit 100 when a memory test is executed.

In the memory mode (BIST mode) in which a memory test is executed, the BIST mode for the selector S1 is set to the on-state, the output selection for the selector S2 is set to the on-state or the off-state, and the processing functions of the ECC circuits 11 and 13 are set to the off-states (S21).

In this manner, the selector S1 forms a path connecting the data output terminal 11b of the ECC circuit 11 with the latch circuit LT3. The selector S2 selectively forms one of the path connecting the latch circuit LT2 with the data input terminal 13a of the ECC circuit 13, and the path connecting the latch circuit LT4 with the data input terminal 13a of the ECC circuit 13. The ECC circuit 11 is set to the state in which the code generating function is disabled. The ECC circuit 13 is set to the state in which the data error detection and correction function is disabled.

Thereafter, the BIST circuit 2 executes a memory test using test data of a predetermined test pattern (S22).

Specifically, test data is output from the BIST circuit 2 such that the test data is supplied into the SRAM macro 1 through the selector 3. In this manner, the test data is successively written to the data storage portion 12a through the latch circuit LT1. The test data is also written to the ECC storage portion 12b through the path K1, the selector S1, and the latch circuit LT3.

When the data storage portion 12a of the SRAM core 12 is tested, the selector S2 is operated to form a path in which the test data read from the data storage portion 12a is transmitted to the data input terminal 13a of the ECC circuit 13 through the latch circuit LT2 and the selector S2. In this manner, the test data read from the data storage portion 12a is transmitted to the BIST circuit 2 and checked.

By contrast, when the ECC storage portion 12b of the SRAM core 12 is tested, the selector S2 is operated to form a path in which the test data read from the ECC storage portion 12b is transmitted to the data input terminal 13a of the ECC circuit 13 through the latch circuit LT4, the path K2, and the selector S2. In this manner, the test data read from the ECC storage portion 12b is transmitted to the BIST circuit 2 and checked. Because the data width of a code is generally smaller than the data width of data, the code can be output using part of the data.

The present embodiment provides a semiconductor integrated circuit enabling the structure to separately execute a test for the SRAM core and a test for the ECC circuit, with a simple structure, in the SRAM macro including the SRAM core and the ECC circuit. In particular, the embodiment adopts a structure using existing circuits in a SRAM macro, and suppresses increase in circuits and influence on the performance thereof. For example, the latch circuits LT1 and LT3 described above correspond to existing input latches generally provided in the input unit of a SRAM macro. The present embodiment adopts a structure in which these existing circuits are also used for testing, and enables achievement of a test circuit while increase in circuits and increase in size are suppressed to minimum.

In addition, in a memory test, the embodiment enables test of the ECC storage portion as well as the data storage portion of the SRAM core, and the ECC circuits can be tested in a scan test. This structure removes the necessity for a structure to additionally supply a test pattern from the BIST circuit or the like to test the ECC circuits, and avoids increase in number of pins of the input and output terminals of the SRAM macro and complicated wiring of peripheral portions.

As described in detail above, the embodiment provides a semiconductor integrated circuit enabling both a test for the memory and a test for the ECC circuits in the memory macro including the memory and the ECC circuits, while suppressing increase in circuit size and influence on the performance thereof.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made. The accompanying claims and their equivalents are intended to cover such forms or modifications as would fall within the scope of the inventions.

The invention claimed is:

1. A semiconductor integrated circuit comprising a memory macro including:
   a first error correction code (ECC) circuit that generates an error detection and correction code corresponding to input data;
   a memory core including a data storage portion on which reading and writing of data is performed, and an ECC storage portion on which reading and writing of a code is performed;
   a second ECC circuit that performs error detection or correction of data to be read from the data storage portion, using a code to be read from the ECC storage portion;
   a first path in which data flows from the first ECC circuit through each of the data storage portion and the ECC storage portion to the second ECC circuit in a memory test; and
   a second path in which data flows, from the first ECC circuit to the second ECC circuit, to bypass the memory core in a scan test.

2. The semiconductor integrated circuit according to claim 1, further comprising:
   a first latch circuit provided on an input side of the data storage portion, and a second latch circuit provided on an output side of the data storage portion; and
   a third latch circuit provided on an input side of the ECC storage portion, and a fourth latch circuit provided on an output side of the ECC storage portion,
   wherein:
   the first latch circuit and the second latch circuit are configured to operate as a flip-flop together in the scan test, and
   the third latch circuit and the fourth latch circuit are configured to operate as a flip-flop together in the scan test.

3. The semiconductor integrated circuit according to claim 1, wherein
   the memory macro further includes a first selector that selects a path in the memory test such that part of the data output from a data output terminal of the first ECC circuit flows to the ECC storage portion.

4. The semiconductor integrated circuit according to claim 3, wherein
   the first selector is achieved using a multiplexer.

5. The semiconductor integrated circuit according to claim 1, wherein
   the memory macro further includes a second selector that selects a path in the memory test such that one of a path in which data output from the data storage portion flows to a data input terminal of the second ECC circuit and a path in which data output from the ECC storage portion flows to the data input terminal of the second ECC circuit is made effective.

6. The semiconductor integrated circuit according to claim 5, further comprising: a memory test circuit that execute, in the memory test, a test for each of the data storage portion and the ECC storage portion, by supplying test data into the memory macro while operating the second selector.

7. The semiconductor integrated circuit according to claim 6, wherein the memory test circuit is a built-in self-test (BIST) circuit included in the semiconductor integrated circuit.

8. The semiconductor integrated circuit according to claim 5, wherein
   the second selector is achieved using a multiplexer.

9. The semiconductor integrated circuit according to claim 1, further comprising: an input that receives a signal that sets, in the memory test, processing functions of the first and the second ECC circuits to disabled states such that data input to each of the first and the second ECC circuits are output without any processing.

10. The semiconductor integrated circuit according to claim 1, wherein
    the memory core is a static random access memory (SRAM) core.

11. The semiconductor integrated circuit according to claim 1, wherein
    the memory macro is a SRAM macro.

* * * * *